US012784358B2

(12) United States Patent
Böckem et al.

(10) Patent No.: US 12,784,358 B2
(45) Date of Patent: Nov. 3, 2026

(54) DIGITAL REALITY PLATFORM PROVIDING DATA FUSION FOR GENERATING A THREE-DIMENSIONAL MODEL OF THE ENVIRONMENT

(71) Applicants: LEICA GEOSYSTEMS AG, Heerbrugg (CH); HEXAGON GEOSYSTEMS SERVICES AG, Heerbrugg (CH); LUCIAD NV, Leuven (BE)

(72) Inventors: Burkhard Böckem, Jonen (CH); Jürgen Dold, Sempach (CH); Pascal Strupler, Ennetbaden (CH); Joris Schouteden, Kessel-Lo (BE); Daniel Balog, Merchtem (BE)

(73) Assignees: LEICA GEOSYSTEMS AG, Heerbrugg (CH); HEXAGON GEOSYSTEMS SERVICES AG, Heerbrugg (CH); LUCIAD NV, Leuven (BE)

( * ) Notice: Subject to any disclaimer, the term of this patent is extended or adjusted under 35 U.S.C. 154(b) by 93 days.

(21) Appl. No.: 19/039,540

(22) Filed: Jan. 28, 2025

(65) Prior Publication Data

US 2025/0173964 A1 May 29, 2025

Related U.S. Application Data

(63) Continuation of application No. 17/790,061, filed as application No. PCT/EP2019/087150 on Dec. 30, 2019, now Pat. No. 12,299,816.

(51) Int. Cl.
*G06T 17/05* (2011.01)
*G01C 15/00* (2006.01)
(Continued)

(52) U.S. Cl.
CPC .............. *G06T 17/05* (2013.01); *G01C 15/00* (2013.01); *G06F 3/04815* (2013.01);
(Continued)

(58) Field of Classification Search
CPC ......... G06T 17/05; G06T 15/04; G06T 19/20; G06T 17/205; G06F 16/29; G06F 3/0485; G06F 30/13; G01C 15/00
See application file for complete search history.

(56) References Cited

U.S. PATENT DOCUMENTS

2005/0223337 A1 10/2005 Wheeler
2007/0014488 A1* 1/2007 Chen .................. G01C 21/3807 382/294
(Continued)

FOREIGN PATENT DOCUMENTS

CN 102074047 A 5/2011
CN 108665536 A 10/2018
(Continued)

OTHER PUBLICATIONS

Zollman, Stephanie, "Augmented Reality for Construction Site Monitoring and Documentation", 2014, IEEE Xplore, vol. 102, pp. 137-154 (Year: 2014).*
(Continued)

*Primary Examiner* — Terrell M Robinson
(74) *Attorney, Agent, or Firm* — Maschoff Brennan

(57) ABSTRACT

The present disclosure relates to three-dimensional reality capturing of an environment, wherein data of various kinds of measurement devices are fused to generate a three-dimensional model of the environment. In particular, the disclosure relates to a computer-implemented method for registration and visualization of a 3D model provided by various types of reality capture devices and/or by various surveying tasks.

20 Claims, 8 Drawing Sheets

(51) Int. Cl.

| | |
|---|---|
| ***G06F 3/04815*** | (2022.01) |
| ***G06F 16/29*** | (2019.01) |
| ***G06F 30/13*** | (2020.01) |
| ***G06T 15/04*** | (2011.01) |
| ***G06T 17/20*** | (2006.01) |
| ***G06T 19/20*** | (2011.01) |

(52) U.S. Cl.
CPC .............. *G06F 16/29* (2019.01); *G06F 30/13* (2020.01); *G06T 15/04* (2013.01); *G06T 17/205* (2013.01); *G06T 19/20* (2013.01)

(56) References Cited

U.S. PATENT DOCUMENTS

| | | | | |
|---|---|---|---|---|
| 2008/0221843 | A1 | 9/2008 | Shenkar et al. | |
| 2009/0245691 | A1 | 10/2009 | Naimark | |
| 2010/0207936 | A1* | 8/2010 | Minear | G06T 7/30 345/419 |
| 2014/0003705 | A1* | 1/2014 | Taguchi | G06T 7/344 382/154 |
| 2014/0095122 | A1 | 4/2014 | Appleman et al. | |
| 2016/0371882 | A1 | 12/2016 | Ege et al. | |
| 2019/0026400 | A1 | 1/2019 | Fuscoe | |
| 2019/0026938 | A1 | 1/2019 | Fuscoe et al. | |
| 2019/0026958 | A1 | 1/2019 | Gausebeck | |
| 2019/0073744 | A1* | 3/2019 | Agarwal | G06T 3/147 |
| 2019/0178654 | A1* | 6/2019 | Hare | G06T 7/70 |
| 2019/0279247 | A1* | 9/2019 | Finken | H04L 9/0637 |
| 2021/0343076 | A1 | 11/2021 | Pennings | |

FOREIGN PATENT DOCUMENTS

| | | | |
|---|---|---|---|
| CN | 110287508 | A | 9/2019 |
| WO | 2007/027847 | A2 | 3/2007 |

OTHER PUBLICATIONS

Zhen, Weikun, “A Joint Optimization Approach of LiDAR-Camera Fusion for Accurate Dense 3-D Reconstructions”, Oct. 2019, IEEE Robotics and Automation Letters, vol. 4, pp. 3585-3592 (Year: 2019).*

Singh, S.P. et al., “Virtual 3D City Modeling: Techniques and Applications,” International Archives of the Photogrammetry, Remote Sensing and Spatial Information Sciences, pp. 73-91 (Nov. 27-29, 2013).

EP Office Action dated Mar. 7, 2025 as received in Application No. 19828802.9.

Teller S, “Toward urban model acquisition from gee-located images,” Computer Graphics and Applications, pp. 45-51 (Oct. 26, 1998).

Bob Mason, “To Snap or not Snap 3D,” Imaginit Civil Solutions Blog, pp. 1 (Sep. 24, 2015).

“AutoCAD Civil 3D 2011 Tutorials” Apr. 2010, pp. 1-840, <https://images.autodesk.com/adsk/files/civil_tutorials0.pdf>.

* cited by examiner

DIGITAL REALITY PLATFORM PROVIDING DATA FUSION FOR GENERATING A THREE-DIMENSIONAL MODEL OF THE ENVIRONMENT

BACKGROUND

The present disclosure generally relates to three-dimensional reality capturing of an environment, wherein data of various kinds of measurement devices are fused to generate a three-dimensional model of the environment.

Within a single framework 3D models of an environment allow for displaying, managing, and analysing complex scenarios. By way of example, 3D digital models of urban areas representing different terrain surfaces and infrastructure, e.g. from the inside and outside, are used in a large number of different application domains, in navigation systems, urban planning and architecture, archaeology, geodesign, emergency management, gaming or augmented reality applications, intelligent transportation systems, property management, and so forth.

The data used to generate a 3D model are multifarious. For example, airborne surveying devices, such as the Leica CityMapper-2, provide photogrammetry data and/or lidar data to generate a three-dimensional model, e.g. a point cloud or a vector file model, of the overflown terrain. The aerial data may be complemented by ground based mobile mapping data—e.g. provided by devices such as the Leica Pegasus: Backpack, the Leica Pegasus: Two, or the Leica BLK2GO—or by high-end laser scanning stations such as the Leica RTC360 or the Leica BLK360. Furthermore, thanks to the variety of different sensors, also features hidden from the human eye can be captured, e.g. by using ground penetrating radar devices to identify underground pipes.

By fusing data of such devices the environment is captured from different perspectives, e.g. from an aerial perspective and from the ground, from the inside and outside of buildings, such that three-dimensional models with customized level of detail for all kinds of different applications can be provided.

The three-dimensional models may then be further processed, e.g. by also including synthetic data, such that a customized visualization of the environment is presented to a user.

However, fusion of different data types and selection of suitable data to be fused remains challenging. In particular, different kinds of user may have different requirements or prerequisites regarding data quality and accuracy, data storage and computing power, and 3D model visualization. Often sophisticated software and an advanced skill level of the user is required to reference (also referred to as "register" or "point set registration") 3D models of different items with respect to each other, i.e. such that the models represent the environment with respect to a common coordinate system. Furthermore, given the large amount of data and the different kinds of data, data handling and selection of relevant data may be cumbersome and, for example, require long experience in reading metadata and/or interpreting raw data.

SUMMARY

It is an object to provide improved fusion of three-dimensional reality capture data.

This object is achieved by realizing at least part the features of the independent claims. Features which further develop such aspects in an alternative or advantageous manner are described in the dependent patent claims.

One aspect relates to a computer-implemented method, comprising

- reading input data providing a translocal (overall) 3D mesh of an environment and a local 3D mesh of an item within the environment, e.g. wherein the item is a certain area within the environment such as a park or a building, or wherein the item is a movable object within the environment such as a car;
- generating on an electronic graphical display a 3D environment visualization of the translocal 3D mesh; and
- inserting a 3D item visualization of the local 3D mesh into the 3D environment visualization, wherein the 3D item visualization is moveable within the 3D environment visualization by means of touchscreen input or mouse input, such that a pre-final placement of the 3D item visualization within the 3D environment visualization is settable by user-input.

By way of example, the 3D environment visualization is a three-dimensional birds-eye view, e.g. implemented to provide 45° angle aerial imagery.

The pre-final placement is used to automatically incorporate the local 3D mesh into the translocal 3D mesh to form a combined 3D mesh, wherefore

- a section of the local 3D mesh corresponding to a spatial border part, e.g. a border line, of the 3D item visualization, considered in the pre-final placement, is compared to a section of the translocal 3D mesh corresponding to an adjacent part, e.g. an adjacent line, of the 3D environment visualization, the adjacent part being adjacent to the spatial border part; and
- based on said comparison, a snapping-in is carried out such that a final placement of the 3D item visualization within the 3D environment visualization, and accordingly a final incorporation of the local 3D mesh into the translocal 3D mesh, is automatically set by refining the pre-final placement in such a way that a spatial discrepancy between the spatial border part of the 3D item visualization and the adjacent part of the 3D environment visualization is minimized.

For example, such snapping-in provides for a fast process of so-called point set registration or point matching of the local 3D model with the translocal 3D model, i.e. finding a spatial transformation that aligns the individual 3D models in order to generate a common (translocal) 3D model. In the prior art, many different point matching algorithms are known, e.g. wherein a point set comprises raw data from 3D scanning and point matching is based on a feature extraction algorithm, e.g. for corner or line detection.

By way of example, the process of registering or incorporation of a local 3D model (e.g. a 3D point cloud or vector file model such as a mesh) into a translocal 3D model involves replacing data of the translocal 3D model relating to the item represented by the local 3D model by data of the local 3D model, or complementing data of the translocal 3D model relating to the item represented by the local 3D model by data of the local 3D model.

For example, as output of the snapping-in the local 3D mesh may be automatically incorporated into the translocal 3D mesh.

In particular, the input data providing the translocal 3D mesh (or more generally a translocal 3D model) comprise aerial surveying data of a surveying device specifically foreseen to be carried by at least one of an aircraft, a satellite, and a surveying balloon, e.g. the surveying device being a Leica CityMapper-2. Alternatively, or in addition, the input data may comprise a 3D terrain and/or city model, e.g. in the form of a 3D point cloud or a 3D vector file model, e.g. such as a 3D mesh model. The input data providing the local 3D mesh (or more generally a local 3D model) may comprise data provided by a surveying station being specifically foreseen to be stationary during data acquisition and comprising at least one of an imager and a laser based ranging device. Alternatively, or in addition the input data providing the local 3D model comprises data provided by a portable surveying device being specifically foreseen to be carried by a human operator or a robotic vehicle, e.g. an automated guided vehicle or an unmanned aerial vehicle, and to be moved during data acquisition. In particular, the portable surveying device comprises at least one of an imager and a laser based ranging device. By way of example, the surveying station may be a Leica RTC360 or a Leica BLK360 and the portable surveying device may be one of a Leica Pegasus:Backpack, a Leica Pegasus:Two, or a Leica BLK2GO. The portable surveying device may further comprise ground penetrating radar technology.

The input data may further provide the translocal and/or the local 3D models as output of an algorithm, e.g. a machine learning algorithm, configured for analyzing and/or combining existing 3D models, e.g. to identify and extract sections from the existing 3D models corresponding to certain items in the environment, e.g. cars or particular kinds of building roofs.

In one embodiment, the snapping-in is initiated in case an absolute vertical offset of at least part of the 3D item visualization with respect to a defined horizontal reference level, e.g. the ground, within the 3D environment visualization falls below a defined snapping-in offset, e.g. wherein the snapping-in offset and/or the reference level is/are settable by user-input.

In a further embodiment, for the snapping-in a correspondence between the local 3D mesh and the translocal 3D mesh is automatically determined by means of a feature matching algorithm identifying corresponding features within the local 3D mesh and a section of the translocal 3D mesh corresponding to a current overlap area between the 3D item visualization and the 3D environment visualization.

For example, for the snapping-in a geometric distortion between the local 3D mesh and the translocal 3D mesh is corrected.

In a further embodiment, the final placement is used for identification of a fraction of the translocal 3D mesh representing a surface area which has a surface type corresponding to a surface area represented by a fraction of the local 3D mesh. Based on that identification, the translocal 3D mesh is processed such that a texture characteristic provided by the translocal 3D mesh for the surface area represented by the fraction of the translocal 3D mesh is changed based on the fraction of the local 3D mesh. Further possible embodiments regarding adaption of texture characteristics are possible, e.g. as described below.

In a further embodiment, a visualization fusion is carried out such that, considered in a current placement of the 3D item visualization, in a section of the 3D environment visualization which corresponds to the 3D item visualization the 3D environment visualization is replaced by the 3D item visualization, and in a surrounding section, which is adjacent to the 3D item visualization and extends away from the 3D item visualization, the 3D environment visualization is replaced by a replacement visualization based on synthetic data, the replacement visualization providing a gapless transition between the 3D item visualization and the remaining of the 3D environment visualization. In other words, the 3D environment visualization makes room for the 3D item visualization, such that the 3D item visualization is seamlessly integrated into the 3D environment visualization and moved within the 3D environment visualization without creating holes in the 3D environment visualization. Further possible embodiments regarding such gapless integration and movement of the 3D item visualization in the 3D environment visualization are possible, e.g. as described below.

The disclosure further relates to a computer program product comprising program code, which, when executed by a computer, causes the computer to carry out the above described method relating to the snapping-in aspect.

A further aspect relates to a computer-implemented method, comprising reading input data providing a translocal 3D model of an environment and a local 3D model of an item within the environment;

generating on an electronic graphical display a 3D environment visualization of the translocal 3D model; and inserting a 3D item visualization of the local 3D model into the 3D environment visualization, wherein the 3D item visualization is moveable within the 3D environment visualization by means of touchscreen input or mouse input, such that a placement of the 3D item visualization within the 3D environment visualization is settable by user-input.

Here, for the placement within the 3D environment visualization the 3D item visualization is moveable by six degrees of freedom, wherein different input modes are provided to position and orient the 3D item visualization within the 3D environment visualization, and in the different input modes movement of the 3D item visualization is restricted to different subsets of the six degrees of freedom. Then, an end state of the placement of the 3D item visualization within the 3D environment visualization is used to automatically incorporate the local 3D model into the translocal 3D model to form a combined 3D model, e.g. a separate 3D model or an update of the translocal 3D model.

For example, the input data providing the translocal 3D model and the local 3D model are of similar kind as described above for the snapping-in aspect. Furthermore, this aspect may be combined with the aspects of adapting texture characteristics (e.g. by using the end state as referencing information) and of providing gapless integration and movement of the 3D item visualization in the 3D environment visualization (e.g. by using the end state as pre-final placement) as described below.

In one embodiment, upon inserting the 3D item visualization into the 3D environment visualization, the 3D item visualization initially has a fixed vertical offset with respect to a horizontal reference level, e.g. the ground, within the 3D environment visualization.

In particular, the reference level is settable by user-input. Therefore, a user may initially choose whether to start the registering process close to the ground or close to a certain height, e.g. when registering 3D model associated to a certain story of a building.

In a further embodiment, the input modes comprise a mode wherein the movement of the 3D item visualization is restricted to a maximum of two different degrees of freedom.

For example, the input modes comprise a mode wherein the subset of the six degrees of freedom maximally consists of two horizontal translational degrees of freedom, and a mode wherein the subset of the six degrees of freedom maximally consists of two rotational degrees of freedom.

In a further embodiment, at least part of the input modes can be activated according to a fixed sequence which separates translation movements and rotational movements, namely wherein the fixed sequence comprises the following two separate subsequences:

- a first subsequence comprising one or a plurality of input modes wherein the subset of the six degrees of freedom each solely consists of translational degrees of freedom, e.g. maximally two translational degrees of freedom each; and
- a second subsequence comprising one or a plurality of input modes wherein the subset of the six degrees of freedom each solely consists of rotational degrees of freedom, e.g. maximally two rotational degrees of freedom each.

In a further embodiment, the input modes comprise an altitude-lock mode wherein, within the 3D environment visualization, the 3D item visualization is kept at a fixed (vertical) displacement with respect to the terrain (the topographical relief) provided by the translocal 3D model, e.g. wherein the amount of the displacement is settable by user input.

In a further embodiment, the 3D item visualization is moveable with respect to the 3D environment visualization by means of multi-touch gestures by the touchscreen input or the mouse input, wherein different multi-touch gestures set different input modes.

For example, sweeping with one finger may be associated to a x-y-movement, sweeping with two fingers (at the same time touching the display) may be associated to yaw and pitch, sweeping with three fingers may be associated to yaw and roll, and tabbing the display may be associated to increasing or decreasing the vertical offset.

Aspects further relate to a computer program product comprising program code, which, when executed by a computer, causes the computer to carry out the above described method relating to the input-movement restriction aspect.

Often, it can be beneficial to have textured 3D models because such textured models make the viewing more natural and thus easier for a user. Typically, texture information is provided by imaging data, e.g. as provided by surveying devices used for generating the local 3D models. Thus, a further aspect is to make use of the texture information provided by the local 3D models in order to improve the texture of the translocal 3D model, wherein identification of matching surfaces—i.e. similar surface types in both the translocal 3D model and the local 3D models which are associated to similar texture characteristics—is supported by using referencing information of the local 3D model with respect to the translocal 3D model.

For example, in a computer-implemented method as described above, the end state can be used for identification of a surface area represented by a fraction of the translocal 3D model which has a surface type corresponding to a surface area represented by a fraction of the local 3D model.

More generally speaking, a further aspect relates to a computer-implemented method comprising the step of reading input data, e.g. of similar kind as described above for the snapping-in aspect, providing

- a translocal 3D model of an environment providing for a textured 3D representation of the environment:
- a local 3D model of a subarea within the environment providing for a textured 3D representation of the subarea; and
- referencing information providing a position of the subarea within the environment.

Here, an identification of a fraction of the translocal 3D model representing a surface area which has a surface type corresponding to a surface area represented by a fraction of the local 3D model is carried out, wherein the identification takes into account the referencing information. Based on this identification, the translocal 3D model is processed such that a texture characteristic provided by the translocal 3D model for the surface area represented by the fraction of the translocal 3D model is changed based on the fraction of the local 3D model.

By way of example, in the course of the processing of the translocal 3D model data of the translocal 3D model are replaced or complemented by data of the local 3D model, and/or data of the translocal 3D model are replaced or complemented by synthetic data.

For example, the identification involves an assignment of different surfaces within the local 3D model and of different surfaces within the translocal 3D model, respectively, into different surface classes by semantic and/or geometric classification, and a comparison of the local 3D model with the translocal 3D model in order to match surfaces assigned to corresponding classes.

The identification may be based on an overlapping of the local 3D model and the translocal model. Thus, in one embodiment, the identification is based on analyzing the local 3D model and the translocal 3D model with respect to at least a part of the subarea which is represented both by the local 3D model and the translocal 3D model.

The identification may also be based on matching or connecting surfaces inside the subarea associated to the local 3D model with immediately adjoining surfaces outside the subarea. Accordingly, in a further embodiment the identification is based on analyzing a part of the local 3D model corresponding to an inside part of the subarea and a part of the translocal 3D model corresponding to an outside part to the subarea, wherein the inside part and the outside part immediately adjoin each other.

Aspects further relate to a computer program product comprising program code, which, when executed by a computer, causes the computer to carry out the above described method relating to the texture adaption aspect.

A further aspect relates to a computer-implemented method, comprising

- reading input data providing a translocal 3D model of an environment and a local 3D model of an item within the environment, e.g. wherein the input data are of similar kind as described above for the snapping-in aspect;
- generating on an electronic graphical display a 3D environment visualization of the translocal 3D model; and
- inserting a 3D item visualization of the local 3D model into the 3D environment visualization, wherein the 3D item visualization is moveable within the 3D environment visualization by means of touchscreen input or mouse input, such that a placement of the 3D item visualization within the 3D environment visualization is settable by user-input.

According to this aspect, a visualization fusion is carried out such that, considered in a current placement of the 3D item visualization,

- in a section of the 3D environment visualization which corresponds to the 3D item visualization the 3D environment visualization is replaced by the 3D item visualization; and
- in a surrounding section, which is adjacent to the 3D item visualization and extends away from the 3D item visualization, the 3D environment visualization is replaced by a replacement visualization based on synthetic data, wherein the replacement visualization provides a gapless transition between the 3D item visualization and the remaining of the 3D environment visualization.

In other words, the 3D environment visualization and the 3D item visualization are combined on-the-fly, wherein the 3D environment visualization adaptively makes room for the 3D item visualization and is restored after movement of the 3D item visualization such that the 3D item visualization can be moved within the 3D environment visualization without creating holes in the 3D environment visualization.

In one embodiment, the replacement visualization provides within the surrounding section a flat, and particularly horizontal, ground section and a transition section providing a connection between the ground section with the remaining of the 3D environment, e.g. wherein the transition section provides a linear height profile transition.

In particular, the ground section connects to the 3D item visualization, e.g. to the lowest vertical point of the 3D item visualization.

In a further embodiment, the visualization fusion comprises that, dynamically considered in each placement of the 3D item visualization, the 3D environment visualization corresponding to a fusion section comprising the respective area of the 3D item visualization, and particularly the respective area of the surrounding section, is temporarily replaced by a visualization providing a, e.g. horizontal, flat plane based on synthetic data, or temporarily replaced by a projection visualization providing a vertical projection of the 3D environment visualization onto a, e.g. horizontal, flat plane, particularly wherein the flat plane extends over the entire fusion section.

In other words, the 3D environment visualization and/or the translocal 3D model is/are dynamically modified for the purpose of smooth transition between the 3D environment visualization and the moveable 3D item visualization, wherein parts of the 3D environment visualization, e.g. parts of the translocal 3D model corresponding to the fusion section, are temporarily removed and restored, e.g. based on a function of coordinates.

For example, the level of the flat plane is fixed, e.g. wherein the flat plane is a defined ground level. Alternatively, the level of the flat plane may dynamically correspond to the respective level (vertical position) of the 3D item visualization within the 3D environment visualization. In particular, the level of the flat plane or the correspondence between the level of the flat plane and the level of the 3D item visualization is settable by user-input.

By way of example, the visualization fusion is initiated in case an absolute vertical offset of at least part of the 3D item visualization with respect to a defined horizontal reference level, e.g. a ground level, within the 3D environment visualization falls below a defined fusion offset, e.g. wherein the fusion offset and/or the reference level is/are settable by user input.

Aspects further relate to a computer program product comprising program code, which, when executed by a computer, causes the computer to carry out the above described method relating to the gapless fusion aspect.

A further aspect relates to a computer-implemented method, comprising reading a plurality of different local 3D models to be referenced to a common coordinate system and corresponding to different areas within an environment, e.g. wherein the local 3D models are foreseen to be incorporated into a translocal 3D model of the environment; and visualizing on an electronic graphical display a task list indicating the different local 3D models, so that the local 3D models can be selected by means of touchscreen input or mouse input.

According to this aspect, in the task list each of the different local 3D models is represented by a corresponding 3D thumbnail visualization of the respective local 3D model, and, within the task list, each of the 3D thumbnail visualizations is automatically changing a respective viewing state, e.g. a respective rotation state. Alternatively, within the task list, a viewing state, e.g. a rotation state, of each of the 3D thumbnail visualizations is settable by user-input, e.g. such as touchscreen input or mouse input.

By way of example, a respective 3D thumbnail visualization is based on a low data size 3D model, e.g. such as a plaster model, providing a lower resolution than the resolution inherently provided by the respective local 3D model.

For example, this aspect simplifies handling of different types of 3D data, such that selection of relevant data is simplified and can be carried out without special experience in reading metadata, e.g. comprised in data headers, and in interpreting raw data.

In one embodiment, upon selection of one of the local 3D models, a 3D main visualization of the selected local 3D model is provided, e.g. a full screen 45° aerial view, wherein the 3D main visualization is different to, e.g. more detailed than, the 3D thumbnail visualization corresponding to the selected local 3D model. Furthermore, the main visualization has a viewing direction which (initially) corresponds to a current viewing direction provided by the 3D thumbnail visualization corresponding to the selected local 3D model.

For example, a user may pre-view the local 3D model in the 3D thumbnail visualization, e.g. by rotating the visualization to identify the surveying task, wherein by selecting the local 3D model the user can directly jump into the, e.g. more detailed full screen, 3D main visualization and maintain the last viewing direction in order to simplify initial orientation within the main visualization.

In a further embodiment, in the task list, initially the 3D thumbnail visualizations are at rest, wherein, within the task list, a change of the viewing state of a first of the 3D thumbnail visualizations can be initiated based on user-input, e.g. such as positioning of a mouse cursor or positioning of a touchscreen input means over a list entry corresponding to the first 3D thumbnail visualization. For example, the list entry may be the first 3D thumbnail visualization or a text corresponding to the first 3D thumbnail visualization, e.g. wherein the text and its corresponding 3D thumbnail visualization are arranged along the same horizontal line.

By way of example, by positioning of the mouse cursor over the list entry an automated rotation is started or the 3D thumbnail visualization is manually rotated, wherein the rotation movement of the 3D thumbnail visualization corresponds to a sweeping movement of the mouse cursor, e.g. different sweeping directions causing rotations in different directions.

In a further embodiment, the 3D thumbnail visualizations are associated to longitudinal list entries of the task list, e.g. wherein the longitudinal list entries each comprise one of the 3D thumbnail visualizations with corresponding text information, wherein, in the task list, the viewing state can be set by moving a mouse cursor or touchscreen input means within its associated longitudinal list entry along a longitudinal axis of its associated list entry. For example, thanks to the sweeping space extending over the extent of the 3D thumbnail visualization, this embodiment may allow for more precise manual movement commands to move the 3D thumbnail visualization.

In a further embodiment, at least one of the 3D thumbnail visualizations provides a representation of its corresponding local 3D model such that the corresponding area within the environment is viewed embedded in part of the environment around an acquisition location of surveying data that provided the local 3D model corresponding to said at least one 3D thumbnail visualization. For example, the environment may be provided by a translocal 3D model as described above and the acquisition location may be roughly known from metadata of the corresponding local 3D model or the embedding position may be known because the corresponding local 3D model is already registered. By way of example, the 3D thumbnail visualization is a white plaster model view wherein the area corresponding to the local 3D model is highlighted by a color.

In particular, the task list may comprise an indication of local 3D models which are already referenced to the common coordinate system.

In a further embodiment, within the task list, the viewing states of the 3D thumbnail visualizations are settable by means of multi-touch gestures by the touchscreen input or the mouse input.

For example, the local 3D models are provided by aerial or ground based reality capture devices, e.g. of similar kind as described above with respect of providing a translocal 3D model and/or local 3D models. The 3D models may further be provided as output of an algorithm, e.g. a machine learning algorithm, configured for analyzing and/or combining existing 3D models, e.g. to identify and extract sections from the existing 3D models corresponding to certain items in the environment, e.g. cars or particular kinds of building roofs.

Aspects further relate to a computer program product comprising program code, which, when executed by a computer, causes the computer to carry out the above described method relating to 3D thumbnails.

A further aspect relates to a computer-implemented method, comprising

- reading input data, e.g. of similar kind as described above, providing a plurality of local 3D models of different subareas within an environment, the local 3D models being based on data associated to different types of surveying devices and referenced with respect to a common coordinate system of a translocal 3D model of the environment, e.g. wherein the local 3D models are incorporated into the translocal 3D model; and
- generating on an electronic graphical display a 3D environment visualization based on the plurality of local 3D models, wherein a first of the different subareas corresponding to a first local 3D model associated to a first type of surveying device is visualized with reduced level of detail compared to the level of detail inherently provided by the first local 3D model, e.g. wherein the first subarea represents a building.

According to this aspect, based on positioning of a mouse cursor or positioning of a touchscreen input means over the first subarea within the 3D environment visualization, the spatial extent of the coverage by the first local 3D model is indicated in the 3D environment visualization, e.g. by indicating border lines, and text is overlaid over the 3D environment visualization naming the first type of surveying device, a date of acquisition of surveying data associated to the first local 3D model and/or a date of creation of the first local 3D model, and a quality parameter providing quality information of the first local 3D model, e.g. a one-dimensional quality index as described below.

In one embodiment, a 3D detail visualization of the first subarea can be activated, e.g. in the 3D environment visualization or on a separate visualization, wherein the 3D detail visualization provides increased level of detail than the initial level of detail provided by the 3D environment visualization, and the text further comprises an instruction on how to activate the 3D detail visualization. For example, the 3D detail visualization provides the level of detail inherently provided by the first local 3D model.

Aspects further relate to a computer program product comprising program code, which, when executed by a computer, causes the computer to carry out the above described method.

A further aspect relates to a computer-implemented method, comprising

- reading input data (e.g. of similar kind as described above) providing a plurality of local 3D models of different subareas within an environment, the local 3D models being referenced with respect to a common coordinate system of a translocal 3D model of the environment, e.g. wherein the local 3D models are incorporated into the translocal 3D model, and provided by different users;
- for each of the local 3D models, carrying out ratings of different quality relationships within the input data which correspond to the respective local 3D model, wherein each of the quality relationships involves a comparison of at least two different quality parameters each; and
- a determination of a one-dimensional quality index for each of the local 3D models based on the ratings of different quality relationships for the respective local 3D model, e.g. wherein the one-dimensional quality index is a number in a defined interval.

In one embodiment, at least one of the different quality relationships is associated to a comparison of parameters of different parameter classes, wherein the parameter classes comprise

- a type identification class providing an indication about a type of surveying device or types of a group of surveying devices associated to the generation of a 3D model; and
- a neighborly relations class providing neighborly relations, e.g. a point density or distribution statistics, between data points of a 3D model.

By way of example, the parameter classes further comprise at least one of

- a class providing an identification of a data outlier;
- a class providing an indication about a classification state of a 3D model regarding classified features within the 3D model;
- a class providing an acquisition time of surveying data associated to the generation of a 3D model and/or a creation time of a 3D model;
- a class providing an indication about a surveying skill level of a user operating a surveying device or a group of surveying devices associated to the generation of a 3D model;
- a class providing an exposure parameter associated to data of an imaging device associated to the generation of a 3D model;
- a class providing a ranging accuracy of data associated to the generation of a 3D model; and a class providing a statistical parameter of data associated to the generation of a 3D model accuracy.

In a further embodiment, the determination of the one-dimensional quality indices is based on a summation of ratings for a given number of pre-defined quality relationships, particularly wherein a failure of providing a quality parameter of one of the pre-defined quality relationships is associated to a pre-defined deduction in the total sum.

In a further embodiment, a weight of a quality parameter of the neighborly relations class is provided by taking into account a quality parameter of the type identification class.

In a further embodiment, a weight of a quality parameter of the neighborly relations class is provided by taking into account the type of the respective local 3D model, e.g. a different weight is provided for a point cloud than for a mesh.

For example, at least two of the local 3D models are based on surveying data sets acquired by different types of surveying devices.

The one-dimensional quality indices may then be indicated in the 3D environment visualization, e.g. based on positioning of a mouse cursor or positioning of a touchscreen input means over a respective subarea within the 3D environment visualization.

In one embodiment, based on a selection of one of the one-dimensional quality indices, e.g. by clicking (by mouse or touchscreen) on the corresponding subarea within the 3D environment visualization, values corresponding to at least part of the quality parameters for determining the selected respective one-dimensional quality index are shown.

Aspects further relate to a computer program product comprising program code, which, when executed by a computer, causes the computer to carry out the above described method relating to the one-dimensional quality index.

A further aspect relates to a computer-implemented method, comprising

- reading input data (e.g. of similar kind as described above) providing a plurality of local 3D models of different subareas within an environment, the local 3D models being referenced with respect to a common coordinate system of a translocal 3D model of the environment, e.g. wherein the local 3D models are incorporated into the translocal 3D model, and provided by different users;
- a user dependent indexing of the input data, wherein for a current user the local 3D models provided by the current user are indexed with a corresponding user ID; and
- generating on an electronic graphical display a 3D environment visualization based on the plurality of local 3D models.

According to this aspect,

- a first of the subareas corresponding to a local 3D model provided by another than the current user is visualized with reduced level of detail compared to the level of detail inherently provided by the corresponding local 3D model, e.g. wherein the first subarea is blurred; and
- a second of the subareas corresponding to a local 3D model provided by the current user is visualized or accessible to be visualized with increased level of detail compared to the level of detail associated to the visualization of the first subarea, e.g. wherein the second subarea is visualized with the level of detail inherently provided by the corresponding local 3D model.

Aspects further relate to a computer program product comprising program code, which, when executed by a computer, causes the computer to carry out the above described method relating to providing an unblurred visualization of own data.

A further aspect relates to a computer-implemented method, comprising reading input data (e.g. of similar kind as described above) providing a plurality of local 3D models of different subareas within an environment, the local 3D models being

- referenced with respect to a common coordinate system of a translocal 3D model of the environment, e.g. wherein the local 3D models are incorporated into the translocal 3D model; and
- based on data associated to different surveying data sets, wherein a first of the local 3D models is assigned to a first user, a second of the local 3D models is assigned to a second user, the first and the second user being different, and the first and the second local 3D models have an overlap regarding one of the subareas.

Here, the method further comprises comparing the first and the second local 3D model in order to determine a deviation information with regard to the first and the second local 3D model, and generating on an electronic graphical display a user dependent 3D environment visualization based on the plurality of local 3D models, wherein

- in an initial state of the 3D environment visualization, the visualization of the one of the subareas is independent of the second local 3D model; and
- based on positioning of a mouse cursor or positioning of a touchscreen input means over the one of the subareas within the 3D environment visualization an indication of the deviation information is provided.

In other words, for example, even though a user might have no access right to the second local 3D model, he is still informed about information provided by the second local 3D model.

In particular, the deviation information provides a comparison of a quality parameter associated to the first local 3D model and/or of a quality parameter associated to the second local 3D model, and a date associated to the generation of the first local 3D model and/or a date associated to the generation of the second local 3D model. Optionally, the deviation information further provides an indication of a device used for generating data associated to the first local 3D model and/or an indication of a device used for generating data associated to the second local 3D model.

By way of example, the user is further given an indication where deviating data is available, i.e. the spatial extent of the overlap is indicated in the 3D environment visualization, e.g. by indicating border lines.

The deviation information may also be provided in that in at least part of the overlap the visualization of the one of the subareas is provided by the second local 3D model such that the visualization of the one of the subareas has reduced level of detail as inherently provided by the second local 3D model, e.g. wherein the one of the subareas is visualized as a white plaster model.

Aspects further relate to a computer program product comprising program code, which, when executed by a computer, causes the computer to carry out the above described method relating to providing initially inaccessible information.

A further aspect relates to a computer-implemented method, comprising

- reading input data (e.g. of similar kind as described above) providing a 3D model of an environment;

generating on an electronic graphical display a 3D visualization of the 3D model providing a visualization of the environment as seen from a viewpoint;

providing a walkthrough functionality, wherein the viewpoint and accordingly the 3D visualization of the 3D model can be changed by user-input, particularly by means of touchscreen input or mouse input;

a storing functionality, wherein a view of at least part of a current 3D visualization of the 3D model can be stored such that a sequence of different views associated to different viewpoints is stored; and a thumbnail visualization is generated, wherein at least a subset of views of the sequence of different views is visualized as 2D or 3D thumbnails arranged chronologically along an elongated thumbnail axis, e.g. wherein the thumbnail visualization is overlaid to the 3D visualization, particularly wherein upon selection of one of the 2D or 3D thumbnails the 3D visualization is automatically set to the corresponding view.

The disclosure further relates to a computer program product comprising program code, which, when executed by a computer, causes the computer to carry out the above described method relating to providing a walkthrough functionality.

A further aspect relates to a computer-implemented method, comprising reading input data (e.g. of similar kind as describe above) providing a sequence of translocal 3D models representing different temporal states of an environment, e.g. wherein each of the translocal 3D models comprises information regarding an acquisition time of a surveying data set associated with the respective model;

generating on an electronic graphical display a first 3D environment visualization of a first of the translocal 3D models; and providing a change functionality, wherein a second of the translocal 3D models is selectable by user-input, based on which, the first 3D environment visualization changes into a second 3D environment visualization of a second of the translocal 3D models.

In one embodiment, the method comprises a determination of a deviation between the first and the second translocal 3D model and a generation of a 3D deviation visualization, wherefore in either the first or the second 3D environment visualization a deviation area corresponding to the deviation is indicated, e.g. by indicating border lines of the deviation area or by a defined colorizing of the deviation area; or a difference 3D environment visualization is generated, with unchanged sections between the first and the second translocal 3D model being faded out or completely omitted in the difference 3D environment visualization.

For example, the difference 3D environment visualization is shown during the transition from the first to the second 3D environment visualization, e.g. wherein it is possible to switch between the difference 3D environment visualization and the first and/or second 3D environment visualization by user-input.

By way of example, such a method improves monitoring the progress of a continuously surveyed construction area in that recent, e.g. even minor, changes are immediately highlighted to a user. For example, in an overall model, minor changes may not be easily visible. However, according to this method, a user may toggle back and forth between the current view and the difference 3D environment visualization to identify changed areas between the current and an older 3D environment visualization.

In particular, a certain user may only be interested in changes measured by a certain type of device, e.g. providing a required accuracy or quality, or a certain user, e.g. of a certain surveying skill level.

Thus, in a further embodiment, the deviation between the first and the second translocal 3D model is determined as a function of a type of surveying device or as a function of a type of user, e.g. wherein the difference 3D environment visualization is restricted to show a difference of the first and the second 3D model which is (e.g. solely) associated to the type of surveying device or the type of user.

Aspects further relate to a computer program product comprising program code, which, when executed by a computer, causes the computer to carry out the above described method relating to a change functionality.

BRIEF DESCRIPTION OF THE DRAWINGS

Different aspects relating to the computer-implemented are described or explained in more detail below, purely by way of example, with reference to working examples shown schematically in the drawing. Identical elements are labelled with the same reference numerals in the figures. The described embodiments are generally not shown true to scale and they are also not to be interpreted as limiting. Specifically.

DETAILED DESCRIPTION

Figure 1:
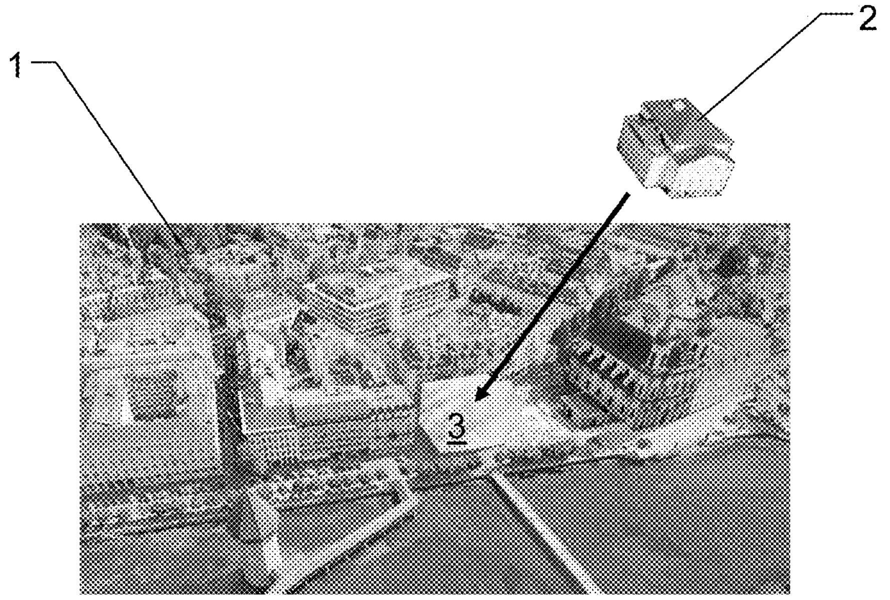
FIG. 1: depicts a 3D environment visualization based on a translocal 3D model and an inserted 3D item visualization based on a local 3D model to be matched with respect to each other.

FIG. 1 schematically depicts a 3D environment visualization 1 based on a translocal 3D model and an inserted 3D item visualization 2 based on a local 3D model to be matched with respect to each other by a process of finding a spatial transformation that aligns the two models.

For example, the translocal 3D model is a city model based on aerial surveying by a Leica CityMapper-2 and the local 3D model is a building model based on (already registered) data of a Leica Pegasus:Backpack and a Leica RTC360 for the outside and a Leica BLK2GO for the inside. Typically, the level of detail of the local 3D model is higher than the overall city model. Here, the 3D models are provided in the form of 3D meshes. Alternatively, the models may be provided in the form of point clouds or any kind of vector file model.

Matching the local building model and the translocal city model typically requires information of a rough alignment and/or orientation of the two models with respect to each other in order that, for example, an automatic feature extraction and matching algorithm can precisely align the two models, e.g. to generate a common 3D model wherein the data of the translocal 3D model corresponding to the area 3 represented by the local 3D model is replaced by data of the local 3D model.

Figure 2:
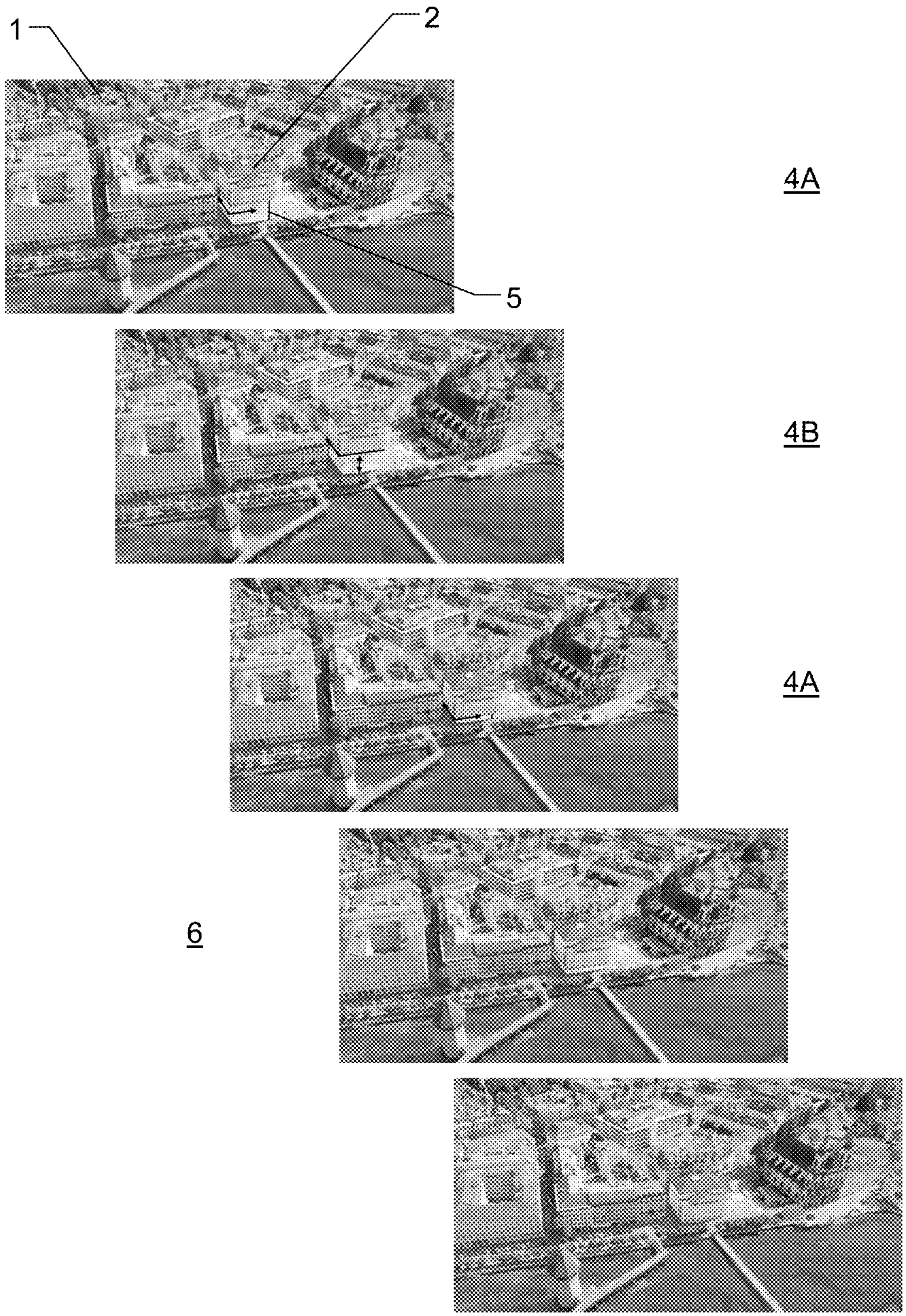
FIG. 2: depicts different states of the 3D environment visualization, when the 3D item visualization is moved within the 3D environment visualization according to the input-movement restriction aspect.

FIG. 2 schematically depicts from top to bottom different states of a 3D visualization comprising the 3D environment visualization 1 based on the translocal 3D model and the 3D item visualization 2 based on the local 3D model as described above for FIG. 1. According to this embodiment of the inventive computer-implemented method a workflow is provided, which provides the above mentioned alignment and/or orientation in order to simplify the registration of the local 3D model and the translocal 3D model.

The 3D item visualization 2 is moveable within the 3D environment visualization 1 by means of touchscreen input or mouse input, wherein different input modes are provided to position and orient the 3D item visualization 2 within the 3D environment visualization 1. By way of example, each input mode restricts movement of the 3D item visualization 2 to exactly two degrees of freedom.

For example, as depicted from top to bottom of the figure, the 3D item visualization 2 has already been rotated into its correct orientation, wherein for finally arranging the represented building it is switched between two different input modes 4A,4B restricting movement of the 3D item visualization 2 to different subsets of translational degrees of freedom each. By way of example,

- in a first input mode 4A, movement of the 3D item visualization 2 is restricted to translations along horizontal (orthogonal) x and y axes, wherein any rotation and the height 5 above ground level are kept fixed, and
- in a second input mode 4B, movement of the 3D item visualization 2 is restricted to adapting the height 5 (along a z axis orthogonal to the x and y axes).

For example, the switch between input modes 4A,4B may be based on a keystroke combo or a multi-touch gesture such as sweeping with one finger for x-y-movement and sweeping with two fingers for the height adjustment.

As soon as the 3D item visualization 2 is close to the ground, a snapping-in may be automatically carried out wherein this pre-final placement is refined in such a way that a spatial discrepancy between the spatial border part of the 3D item visualization 2 and an adjacent part of the 3D environment visualization is minimized.

After placing the 3D item visualization 2 to an end position 3, the relative configuration 6 between the 3D environment visualization 1 and the 3D item visualization 2 is locked and used, e.g. by an automatic feature extraction and matching algorithm, to precisely align the two models in order to generate a common 3D model visualized in the bottom frame of the figure.

Figure 3:
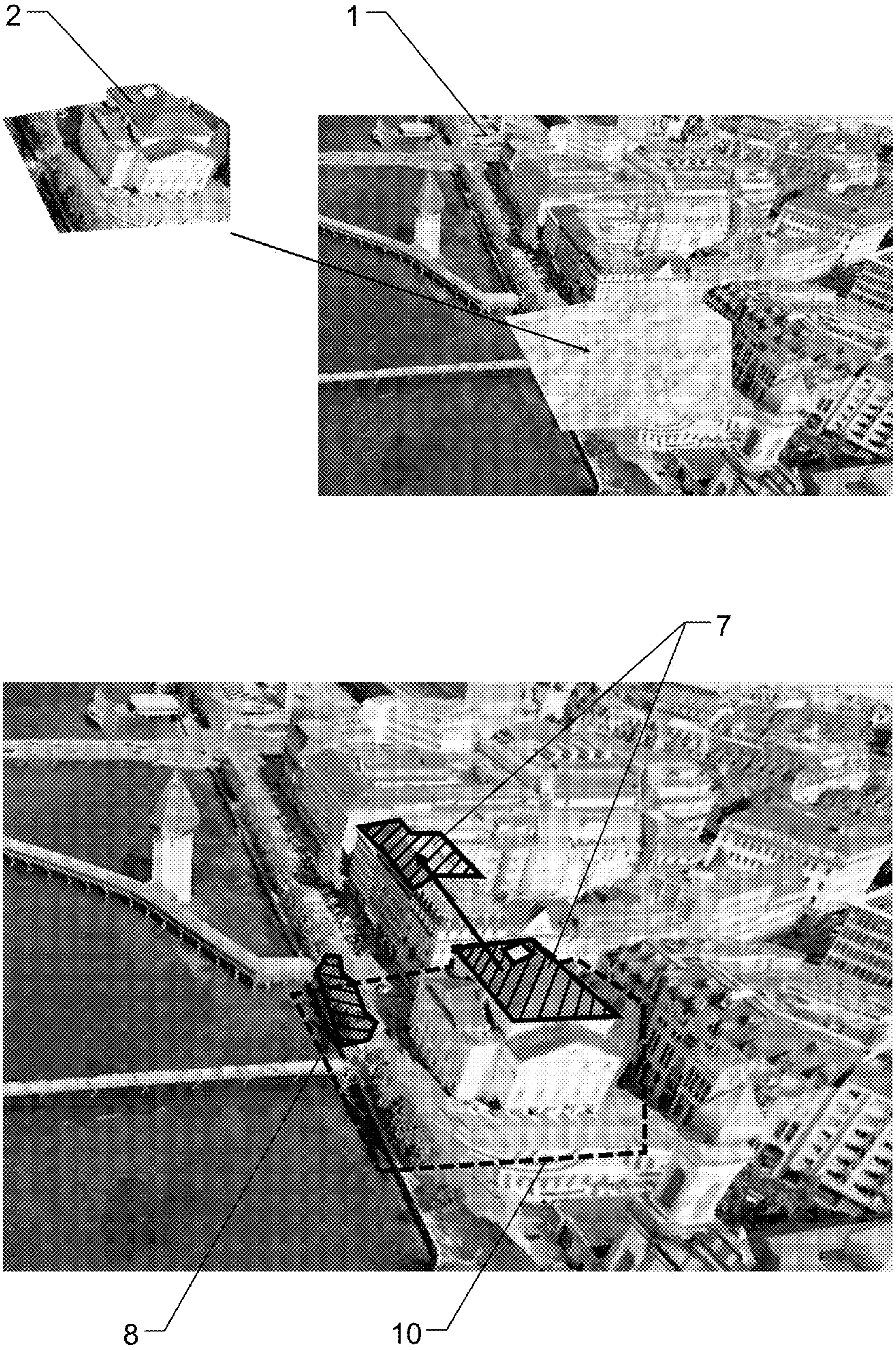
FIG. 3 depicts an embodiment of the inventive computer-implemented method, wherein texture information provided by a local 3D model is used to adapt the texture provided by a translocal 3D model.

FIG. 3 schematically depicts an embodiment of the inventive computer-implemented method, wherein texture information provided by a local 3D model is used to adapt the texture provided by a translocal 3D model.

Here, reference information providing an alignment of the local 3D model and the translocal 3D model is used to support identification of matching surfaces being associated to similar texture characteristics, e.g. water surfaces, roof areas 7, or particular vegetation, e.g. similar kind of trees 8. By way of example, the reference information is inherently provided in case of registered 3D models. Alternatively, the reference information may be based on additional information, e.g. positioning information provided by metadata of the respective 3D models.

The top part of the figure shows a 3D environment visualization 1 based on the translocal 3D model and a 3D item visualization 2 based on the local 3D model to be inserted into the 3D environment visualization 1, and the bottom part shows a visualization of a common 3D model 9, wherein the extent of the subarea corresponding to the local 3D model is indicated by a dashed line 10.

By way of example, the identification is based on finding connecting surface types which immediately adjoin each other at the transition between the area 10 associated to the local 3D model and the neighboring translocal 3D model, e.g. such as it is indicated for one of the tree areas 8. Furthermore, the reference information may also provide for identification of matching surface types in an extended neighborhood around the area 10 associated to the local 3D model, e.g. such as it is indicated for the roof area 7.

Figure 4:
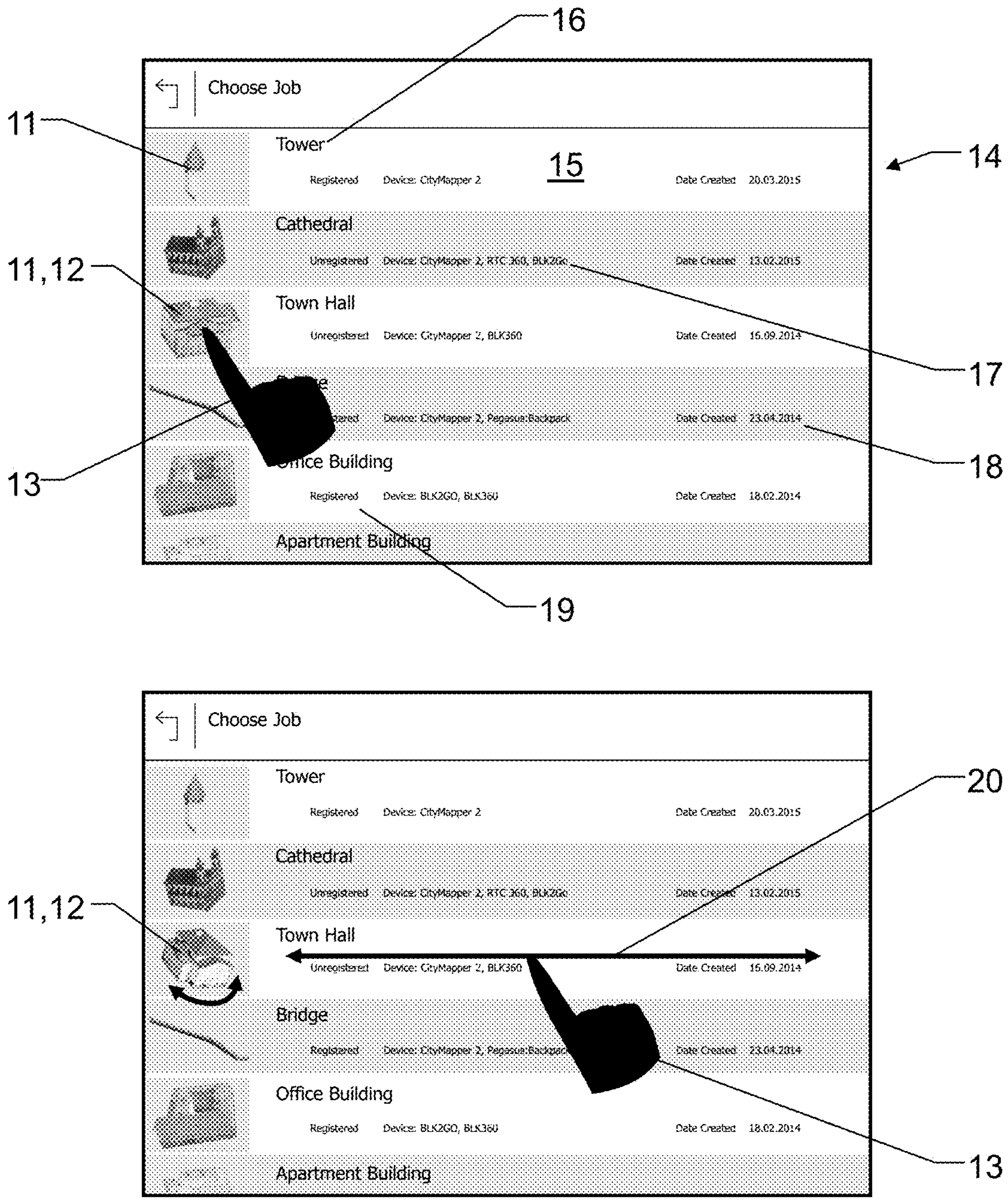
FIG. 4 depicts an inventive task list comprising 3D thumbnail visualizations.

FIG. 4 schematically depicts a task list according to a further embodiment of the inventive computer-implemented method, the top part of the figure showing an initial state of the task list, wherein 3D thumbnail visualizations 11 are at rest, and the bottom part showing a state of the task list, wherein one of the 3D thumbnail visualizations 12 is automatically rotating upon preselection by touchscreen input 13. Therefore, a user may pre-view the data set corresponding to a list entry 14 based on the 3D thumbnail visualization 11, 12, which, for example, simplifies data selection and interpretation of additional data information in a text section 15 of the list entry 14 (each list entry 14 comprising one of the 3D thumbnail visualizations and a corresponding text section).

In particular, the text section 15 comprises a project name 16, the type 17 of surveying device(s) underlying the corresponding data set, and the date 18 of data acquisition and/or model creation. The text section 15 may comprise further information, e.g. an indication 19 that a data set is already registered or still unregistered.

Instead of simply rotating, the 3D thumbnail visualizations 11, 12 may move within the task list such that in general a viewing state is changed, e.g. change of orientation of the represented item, zooming in/out, or a lateral movement of the represented item.

By way of example, the viewing state of each of the 3D thumbnail visualizations 11, 12 is settable by touchscreen input or mouse input, e.g. wherein the viewing state can be set by moving a mouse cursor or touchscreen input means within its associated longitudinal list entry along a longitudinal axis 20 of its associated list entry.

Figure 5:
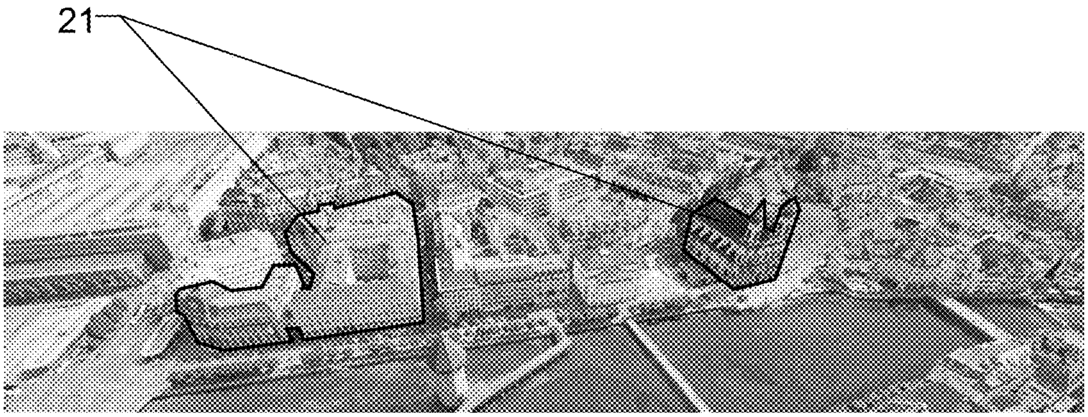
FIG. 5 depicts a 3D environment visualization, wherein a user is provided with information that certain areas and buildings are available with increased level of detail or may be inspected based on different surveying data.
Figure 5:
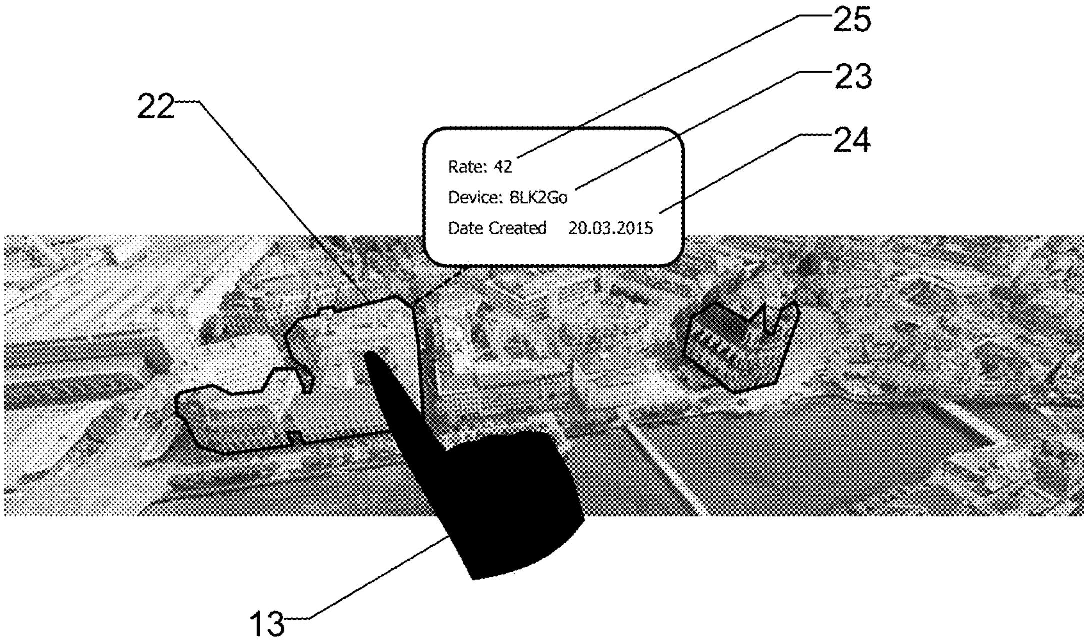
Figure 6:
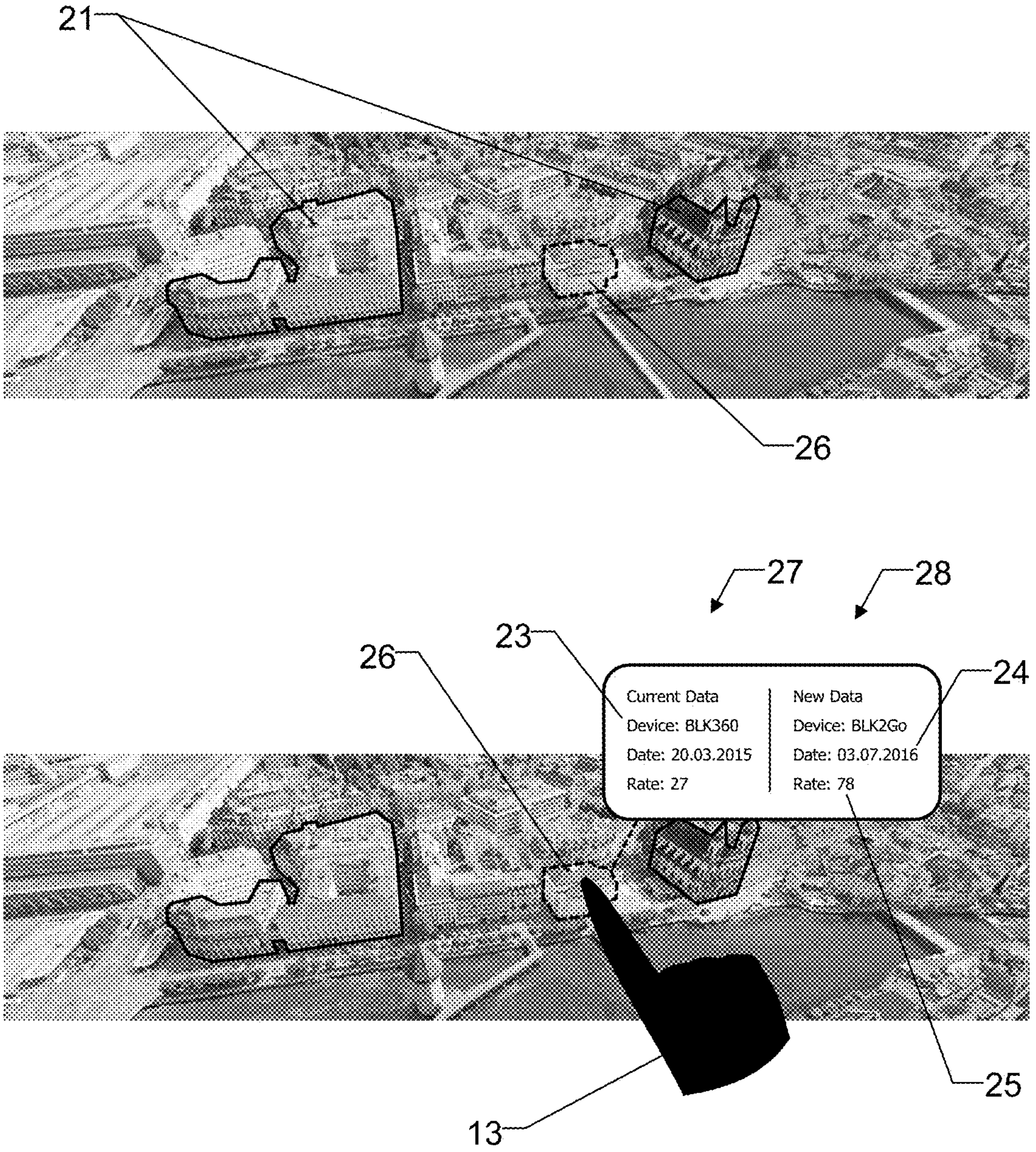
FIG. 6 depicts a 3D environment visualization, wherein different local 3D models are assigned to different users and a deviation indication determined from initially inaccessible information is provided to a current user.

FIGS. 5 and 6 exemplarily show a 3D environment visualization, e.g. a so-called 3D map view, based on a plurality of local 3D models as it may be generated on an electronic graphical display. For example, the translocal 3D model is provided by registering a variety of different datasets from ground-based and airborne surveying devices, e.g. the Leica surveying devices as mentioned above, and possibly by adding additional artificial data such as computer-aided design data.

The 3D environment visualization provides for setting different viewing perspectives, e.g. a virtual tour through the captured environment to examine the inside and outside of buildings with customized level of detail, wherein the accessible level of detail of visualized areas and buildings varies, e.g. depending on a user category of a current user or depending on a defined initialization setting of the translocal 3D visualization, e.g. wherein the 3D environment visualization is only based on data of certain surveying devices. In other words, some of the areas and buildings are visualized with reduced level of detail compared to the level of detail inherently provided by the corresponding surveying data sets.

However, as indicated by FIG. 5, in the 3D map view (3D environment visualization), a user is provided with information that certain areas and buildings 21 are available with increased level of detail or may be inspected based on different surveying data. For example, buildings 21 are marked and indicated for which additional local 3D scans have been carried out, e.g. by other users, and are stored and available. By preselecting buildings these buildings 21 within the 3D map view, e.g. by moving a mouse cursor or a touchscreen input means 13 over the respective areas, an area corresponding to the extent of the preselected surveying data set (providing a local 3D model) is automatically marked with its boarders 22 and text with additional information is overlaid, e.g. naming the used surveying device 23, a creation date 24, and quality indication 25, e.g. in the form of a one-dimensional quality index.

Further information may be an indication of the user who acquired the additional data, e.g. together with an indication of a skill level of this user, an indication on conditions during the data acquisition, and criteria to get access to the data.

FIG. 6 relates to an embodiment of a computer program product, wherein different local 3D models are assigned to different users, wherein initially each user only sees visualizations corresponding to his assigned local 3D models. For example, certain users may initially only be interested in viewing building models of a certain level of detail or originating from a certain type of surveying device.

However, the computer program product is configured to cause a comparison of the local 3D models across the different user assignments in order to determine a deviation information with regard to a current visualization of a building and available visualizations assigned to other users. Therefore, a current user can be informed that for a certain currently visualized building 26 deviating information is available. Furthermore, based on positioning of a mouse cursor or positioning of a touchscreen input means 13 over the respective building visualization 26, a text bubble provides comparison info such that the user is provided a comparison between current data characteristics 27 and additional data characteristics 28, e.g. a comparison of a quality parameter 25, the respectively used devices 23, and the respective creation dates 24.

Thus, even though a user has no immediate access to the additional data set or the additional local 3D model, he is still able to assess the value of his current building visualization. For example, the computer program product may further provide a search and/or filtering of external data (not assigned to a current user), e.g. with regard to a quality parameter or a specific surveying device, wherein found data, particularly corresponding deviations, is specifically indicated in the 3D map view.

By way of example, the computer program product may also provide a functionality that a user can mark deficient sections or items in his assigned data, wherein, even though he has no access to external data, the external data is searched for candidates to correct or fix the deficiency. Based on this search, the computer program product will then initiate a display of a preview for improvement, wherein the external data is visualized with reduced level of detail as inherently provided by the external local 3D model, i.e. potential "replacement" data is not fully displayed in the initial 3D visualization for the current user.

Figure 7:
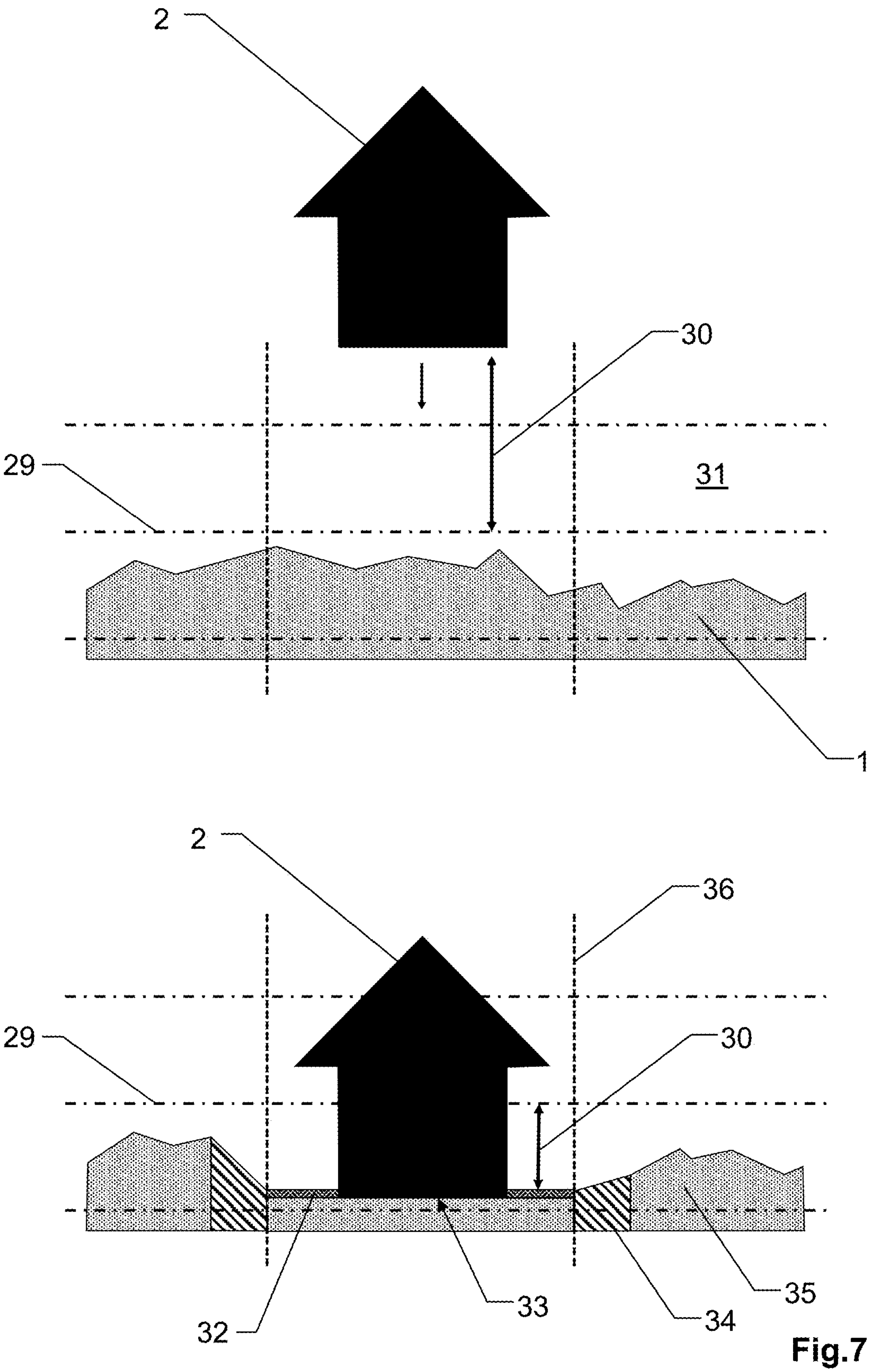
FIG. 7 depicts, for the sake of simplicity in 2D, an embodiment having a visualization fusion.
Figure 8:
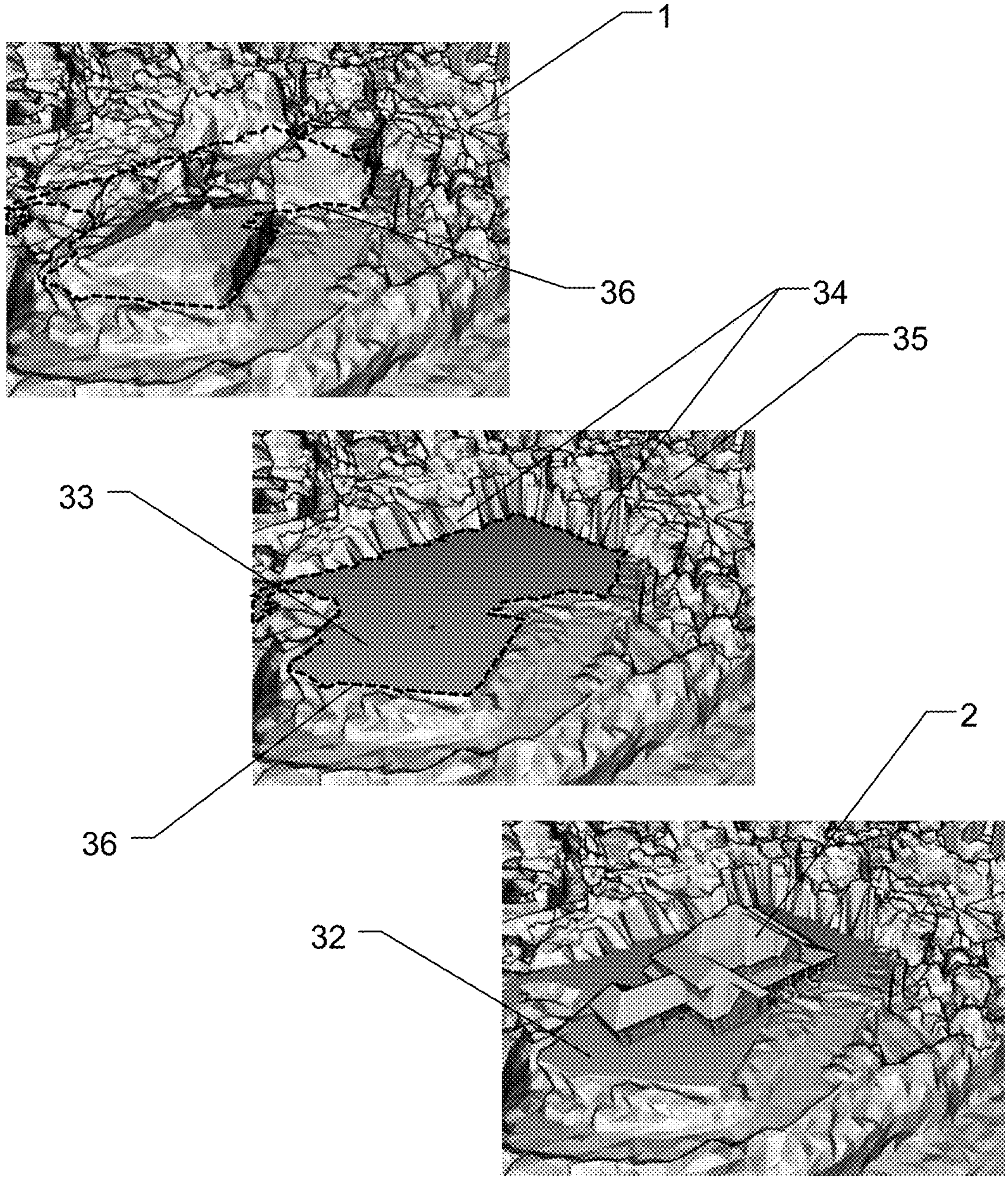
FIG. 8 depicts a visualization fusion in 3D.

FIGS. 7 and 8 relate to an embodiment having a visualization fusion, wherein inclusion of the 3D item visualization 2, here of a building, into the 3D environment visualization 1 is adapted to provide a gapless visualization of the included object within the environment. For the sake of simplicity, FIG. 7 depicts the visualization fusion in 2D space, whereas FIG. 8 depicts a more realistic example in 3D.

By way of example, as depicted by the top part of FIG. 7, the 3D item visualization 2 approaches a defined horizontal reference level 29, which, for example, is definable by user input. As soon as the offset 30 between a lower point of the 3D item visualization falls below a defined fusion distance to the horizontal reference level 29, e.g. defining a fusion band 31, visualization fusion is initialized.

During visualization fusion, as depicted by the bottom part of FIG. 7, a synthetic flat ground section 32 is added to the 3D item visualization provided by the local 3D model, namely such that the 3D environment visualization corresponding to the 3D item visualization is replaced by the 3D item visualization 2 which now has so-called "wings" 32 fixed to the bottom of the 3D item visualization and co-moving with the 3D item visualization.

By way of example, in order to make room for the 3D item visualization 2 and the ground section 32 the corresponding 3D environment visualization is vertically projected onto a horizontal flat plane 33. In other words, the 3D environment visualization is "pushed down" (as shown in the figure) and/or "pulled up" (not shown) to the horizontal flat plane 33.

In a transition section 34, the ground section 32 connects to the remaining 35 of the 3D environment visualization, e.g. in such a fashion, as depicted in the figure, that between the flat ground section 32 and the remaining 35 of the 3D environment visualization a linear height profile transition is provided.

Referring now to FIG. 8, the top part shows the 3D environment visualization 1 without inserted 3D item visualization, wherein the bottom part shows the situation during visualization fusion when inserting the 3D item visualization 2 into the 3D environment visualization 1.

The middle part of FIG. 8 shows a transition step wherein the 3D environment visualization corresponding to the 3D item visualization 2 and the flat ground section 32 is vertically projected onto a horizontal flat plane 33. For illustrative purposes the outer border 36 of the horizontal flat plane 33 is depicted in the top and the middle part of the figure. Adjacent to the flat plane 33 starts the transition section 34, which provides a linear height profile transition between the ground section 32 and the remaining 35 of the 3D environment visualization.

Although aspects are illustrated above, partly with reference to some preferred embodiments, it must be understood that numerous modifications and combinations of different features of the embodiments can be made. All of these modifications lie within the scope of the appended claims.

What is claimed is:

1. A computer-implemented method, comprising:

reading input data providing a plurality of local 3D models of different subareas within an environment, the local 3D models being referenced with respect to a common coordinate system of a translocal 3D model of the environment, particularly wherein the local 3D models are incorporated into the translocal 3D model, and based on data associated to different surveying data sets, wherein a first of the local 3D models is assigned to a first user, a second of the local 3D models is assigned to a second user, the first and the second user being different, and the first and the second local 3D models have an overlap regarding one of the subareas;

comparing the first and the second local 3D model in order to determine a deviation information with regard to the first and the second local 3D model; and generating, on an electronic graphical display, a user-dependent 3D environment visualization based on the plurality of local 3D models, wherein in an initial state of the 3D environment visualization, the visualization of the one of the subareas is independent of the second local 3D model, and an indication of the deviation information is provided based on a positioning of a mouse cursor or a positioning of a touchscreen input means over the one of the subareas within the 3D environment visualization.

2. The method according to claim 1, wherein the deviation information provides a comparison of a quality parameter associated to the first local 3D model and/or of a quality parameter associated to the second local 3D model, and a date associated to the generation of the first local 3D model and/or a date associated to the generation of the second local 3D model.

3. The method according to claim 2, wherein the deviation information provides an indication of a device used for generating data associated to the first local 3D model and/or an indication of a device used for generating data associated to the second local 3D model.

4. The method according to claim 1, wherein the spatial extent of the overlap is indicated in the 3D environment visualization.

5. The method according to claim 4, wherein the spatial extent of the overlap is indicated by indicating border lines of the overlap in the 3D environment visualization.

6. The method according to claim 1, wherein the deviation information is provided in that in at least part of the overlap the visualization of the one of the subareas is provided by the second local 3D model such that the visualization of the one of the subareas has a reduced level of detail as inherently provided by the second local 3D model.

7. The method according to claim 1, wherein the local 3D models are provided by at least one of:

aerial surveying data of a surveying device specifically foreseen to be carried by at least one of an aircraft, a satellite, and a surveying balloon;

a 3D terrain model and/or a 3D city model;

data provided by a surveying station being specifically foreseen to be stationary during data acquisition and comprising at least one of an imager and a laser based ranging device; and data provided by a portable surveying device being specifically foreseen to be carried by a human operator or a robotic vehicle and to be moved during data acquisition, the portable surveying device comprising at least one of an imager and a laser based ranging device.

8. The method according to claim 1, wherein the local 3D models are provided by a 3D terrain model and/or a 3D city model in the form of a 3D point cloud, a 3D vector file model or a 3D mesh.

9. A computer program product comprising program code stored in a non-transitory machine-readable medium, which, when executed by a computer, causes the computer to carry out the method according to claim 1.

10. A computer-implemented method, comprising reading input data providing a sequence of translocal 3D models representing different temporal states of an environment, generating on an electronic graphical display a first 3D environment visualization of a first of the translocal 3D models, and providing a change functionality, wherein a second of the translocal 3D models is selectable by user input, based on which, the first 3D environment visualization changes into a second 3D environment visualization of a second of the translocal 3D models.

11. The method according to claim 10, wherein each of the translocal 3D models comprises information regarding an acquisition time of a surveying data set associated with the respective model.

12. The method according to claim 10, comprising determining a deviation between the first and the second translocal 3D models and generating a 3D deviation visualization.

13. The method according to claim 12, wherein in either the first or the second 3D environment visualization a deviation area corresponding to the deviation is indicated.

14. The method according to claim 13, wherein the deviation area corresponding to the deviation is indicated by indicating border lines of the deviation area or by a defined colorizing of the deviation area.

15. The method according to claim 14, wherein a difference 3D environment visualization is generated, with unchanged sections between the first and the second translocal 3D model being faded out or completely omitted in the difference 3D environment visualization.

16. The method according to claim 15, wherein the difference 3D environment visualization is shown during the transition from the first to the second 3D environment visualization, wherein a user is enabled to switch between the difference 3D environment visualization and the first and/or second 3D environment visualization by user-input.

17. The method according to claim 12, wherein the deviation between the first and the second translocal 3D model is determined as a function of a type of surveying device or as a function of a type of user.

18. The method according to claim 17, wherein the difference 3D environment visualization is restricted to show a difference of the first and the second 3D model which is associated to the type of surveying device or the type of user.

19. The method according to claim 10, wherein the input data providing the sequence of translocal 3D models comprise at least one of:

aerial surveying data of a surveying device specifically foreseen to be carried by at least one of an aircraft, a satellite, and a surveying balloon;

a 3D terrain model and/or a 3D city model;

a 3D point cloud, a 3D vector file model or a 3D mesh;

data provided by a surveying station being specifically foreseen to be stationary during data acquisition and comprising at least one of an imager and a laser based ranging device; and data provided by a portable surveying device being specifically foreseen to be carried by a human operator or a robotic vehicle and to be moved during data acquisition, the portable surveying device comprising at least one of an imager and a laser based ranging device.

20. A computer program product comprising program code stored in a non-transitory machine-readable medium, which, when executed by a computer, causes the computer to carry out the method according to claim 10.

* * * * *